(12) United States Patent
Cheng et al.

(10) Patent No.: US 10,635,218 B2
(45) Date of Patent: Apr. 28, 2020

(54) PRESSURE DETECTION CIRCUIT, PRESSURE DETECTION CIRCUIT ARRAY, TOUCH PANEL AND DETECTION METHOD

(71) Applicant: BOE Technology Group Co., Ltd., Beijing (CN)

(72) Inventors: ChihJen Cheng, Beijing (CN); Haisheng Wang, Beijing (CN); Yuzhen Guo, Beijing (CN); Xiaoliang Ding, Beijing (CN); Yingming Liu, Beijing (CN); Pengpeng Wang, Beijing (CN); Xueyou Cao, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 36 days.

(21) Appl. No.: 16/107,597

(22) Filed: Aug. 21, 2018

(65) Prior Publication Data
US 2019/0220129 A1    Jul. 18, 2019

(30) Foreign Application Priority Data
Jan. 12, 2018 (CN) .......................... 2018 1 0033614

(51) Int. Cl.
| G06F 3/041 | (2006.01) |
| G06F 3/045 | (2006.01) |
| G01L 1/20 | (2006.01) |
| G01L 1/22 | (2006.01) |
| G01R 27/14 | (2006.01) |

(52) U.S. Cl.
CPC ............ *G06F 3/0414* (2013.01); *G01L 1/205* (2013.01); *G01L 1/225* (2013.01); *G06F 3/045* (2013.01); *G06F 3/0416* (2013.01); *G06F 3/04144* (2019.05); *G01R 27/14* (2013.01)

(58) Field of Classification Search
None
See application file for complete search history.

(56) References Cited

U.S. PATENT DOCUMENTS

| 5,374,787 A * | 12/1994 | Miller .................. G06F 1/1626 |
| | | 178/18.06 |
| 2013/0021544 A1* | 1/2013 | Fukuyama .......... G02F 1/13338 |
| | | 349/12 |

* cited by examiner

*Primary Examiner* — Roy P Rabindranath
(74) *Attorney, Agent, or Firm* — Westman, Champlin & Koehler, P.A.

(57) ABSTRACT

The present disclosure discloses a pressure detection circuit, a pressure detection circuit array, a touch panel, and a detection method. The pressure detection circuit comprises: a collection sub-circuit configured to receive an external pressure signal and convert the external pressure signal into a voltage signal under the control of a gating signal; and a reading sub-circuit configured to receive the voltage signal, and output a detection output signal related to the voltage signal, wherein the collection sub-circuit and the reading sub-circuit are powered by a constant current source respectively.

14 Claims, 4 Drawing Sheets

PRESSURE DETECTION CIRCUIT, PRESSURE DETECTION CIRCUIT ARRAY, TOUCH PANEL AND DETECTION METHOD

CROSS-REFERENCE TO RELATED APPLICATION(S)

This application claims priority to the Chinese Patent Application No. CN201810033614.8, filed on Jan. 12, 2018, which is incorporated herein by reference in its entirety.

TECHNICAL FIELD

The present disclosure generally relates to the field of pressure detection, and more particularly, to a pressure detection circuit, a pressure detection circuit array, a touch panel, and a detection method.

BACKGROUND

The pressure detection technology is a technology for detecting an external pressure, which is widely used in various fields, for example, portable electronic devices such as mobile phones, tablets etc.

A pressure detection circuit in the related art generally comprises a piezoresistive sensor, a gating transistor and a voltage amplifier, wherein the piezoresistive sensor, the gating transistor and the voltage amplifier are sequentially connected, the voltage amplifier is connected in parallel to a feedback resistor, the piezoresistive sensor is connected to a reference voltage, and an output terminal of the voltage amplifier outputs a detection voltage signal. As the piezoresistive sensor is connected to the amplifier, the detection of the circuit is in a normally open state, that is, regardless of whether a current pressure detection circuit is gated, an output signal thereof is always connected to the output terminal. Therefore, leakage current of an un-gated pressure detection circuit influences the accuracy of the detection of a gated pressure detection circuit.

SUMMARY

According to a first aspect of the present disclosure, there is provided a pressure detection circuit, comprising:

a collection sub-circuit configured to receive an external pressure signal and convert the external pressure signal into a voltage signal under the control of a gating signal; and a reading sub-circuit configured to receive the voltage signal, and output a detection output signal related to the voltage signal, wherein the collection sub-circuit and the reading sub-circuit are powered by a constant current source respectively.

In one or more embodiments of the present disclosure, the collection sub-circuit comprises:

a piezoresistive sensor having a first terminal configured to receive a first voltage signal and a second terminal connected to a collection node, wherein the piezoresistive sensor is configured to change a resistance value thereof according to the external pressure signal; and a first gating transistor having a gate configured to receive the gating signal, a first electrode connected to the collection node, and a second electrode connected to a first constant current source, wherein the first gating transistor is configured to cause a voltage signal corresponding to the resistance value of the piezoresistive sensor to be output at the collection node under the control of the gating signal.

In one or more embodiments of the present disclosure, the reading sub-circuit comprises:

a voltage follower configured to output a detection output signal which is positively correlated with the voltage signal under the control of the voltage signal.

In one or more embodiments of the present disclosure, the voltage follower comprises a follower transistor having a gate connected to the collection node, a first electrode connected to a second constant current source, and a second electrode configured to receive a second voltage signal, wherein the first electrode of the follower transistor further acts as an output terminal for outputting the detection output signal.

In one or more embodiments of the present disclosure, the voltage follower comprises a follower transistor and a second gating transistor, wherein the follower transistor has a gate connected to the collection node, a first electrode connected to a second electrode of the second gating transistor, and a second electrode connected to a second voltage signal, the second gating transistor has a gate configured to receive the gating signal, and a first electrode connected to a second constant current source, wherein the first electrode of the second gating transistor further acts as an output terminal for outputting the detection output signal, and the second gating transistor is configured to turn on/off a connection between the follower transistor and the output terminal under the control of the gating signal.

In one or more embodiments of the present disclosure, the resistance value of the piezoresistive sensor decreases as the external pressure signal increases.

According to a second aspect of the present disclosure, there is provided a pressure detection circuit array, comprising a plurality of pressure detection circuits.

In one or more embodiments of the present disclosure, gating terminals of the same row of pressure detection circuits are electrically connected and receive the same gating signal, and output terminals of the same column of pressure detection circuits are electrically connected and output a detection output signal, a first constant current source supplies constant current to collection sub-circuits of the same column of pressure detection circuits, and a second constant current source supplies constant current to reading sub-circuits of the same column of pressure detection circuits.

In one or more embodiments of the present disclosure, the collection sub-circuit comprises:

a piezoresistive sensor having a first terminal configured to receive a first voltage signal and a second terminal connected to the collection node, wherein the piezoresistive sensor is configured to change a resistance value thereof according to an external pressure signal; and a first gating transistor having a gate configured to receive the gating signal, a first electrode connected to the collection node, and a second electrode connected to a first constant current source, wherein the first gating transistor is configured to cause a voltage signal corresponding to the resistance value of the piezoresistive sensor to be output at the collection node under the control of the gating signal.

In one or more embodiments of the present disclosure, the reading sub-circuit comprises:

a voltage follower configured to output a detection output signal which is positively correlated with the voltage signal under the control of the voltage signal.

In one or more embodiments of the present disclosure, the voltage follower comprises a follower transistor having a gate connected to the collection node, a first electrode connected to a second constant current source, and a second electrode configured to receive a second voltage signal, wherein the first electrode of the follower transistor further acts as an output terminal for outputting the detection output signal.

In one or more embodiments of the present disclosure, the voltage follower comprises a follower transistor and a second gating transistor, wherein the follower transistor has a gate connected to the collection node, a first electrode connected to a second electrode of the second gating transistor, and a second electrode connected to a second voltage signal, the second gating transistor has a gate configured to receive the gating signal, and a first electrode connected to a second constant current source, wherein the first electrode of the second gating transistor further acts as an output terminal for outputting the detection output signal, and the second gating transistor is configured to turn on/off a connection between the follower transistor and the output terminal under the control of the gating signal.

In one or more embodiments of the present disclosure, the resistance value of the piezoresistive sensor decreases as the external pressure signal increases.

According to a third aspect of the present disclosure, there is provided a touch panel, comprising an array of pixel units and a pressure detection circuit array, wherein each of the pixel units has a pressure detection circuit provided therein.

According to a fourth aspect of the present disclosure, there is provided a pressure detection method of the touch panel according to claim 14, comprising:

transmitting a gating signal to the pressure detection circuits in the touch panel row by row; and reading detection output signals of each column of pressure detection circuits, and determining a pixel unit to which an external pressure is applied according to a current gating signal and each of the detection output signals.

BRIEF DESCRIPTION OF THE DRAWINGS

Other features, purposes, and advantages of the present disclosure will become more apparent from the detailed description of non-limiting embodiments with reference to the following accompanying drawings, in which.

DETAILED DESCRIPTION

Figure 1:
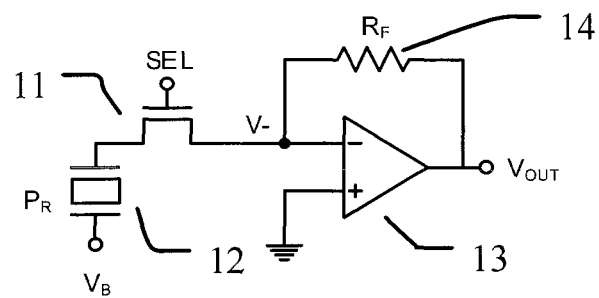
FIG. 1 illustrates an exemplary circuit structural diagram of a pressure detection circuit in the related art.

As shown in FIG. 1, illustrated is an exemplary circuit structural diagram of a pressure detection circuit in the related art. As shown in FIG. 1, the pressure detection circuit in the related art comprises a piezoresistive sensor 12, a gating transistor 11 and a resistive voltage amplifier 13. A resistance value of the piezoresistive sensor 12 is set to be $R_X$, a resistance value of a resistor 14 connected in parallel to the amplifier 13 is set to be $R_F$, and then $V_{OUT}$ is $$V_B \times \frac{R_F}{R_X}.$$

Therefore, a change in resistance of the piezoresistive sensor 12 can be known by using a change in $V_{OUT}$, thereby determining whether there is an external pressure. However, as the piezoresistive sensor is connected to the amplifier, the detection of the circuit is in a normally open state, and thus leakage current of an un-gated pressure detection circuit influences the accuracy of the detection of a gated pressure detection circuit.

In view of the above-mentioned deficiencies in the related art, the present disclosure provides a pressure detection circuit, a pressure detection circuit array, a touch panel, and a detection method with a high accuracy.

The present disclosure will be further described in detail below in conjunction with the accompanying drawings and embodiments. It can be understood that specific embodiments described here are merely illustrative of the present disclosure and are not intended to limit the present disclosure. It is also to be illustrated that, for the convenience of description, only parts related to the present disclosure are shown in the accompanying drawings.

It should be illustrated that the embodiments in the present disclosure and features in the embodiments can be combined with each other without a conflict. The present disclosure will be described in detail below with reference to the accompanying drawings and in combination with the embodiments.

Figure 2:
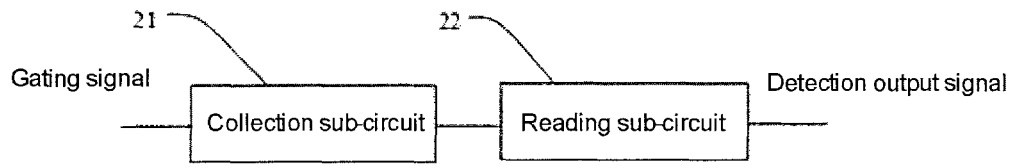
FIG. 2 illustrates an exemplary structural block diagram of a pressure detection circuit according to an embodiment of the present disclosure.

As shown in FIG. 2, illustrated is an exemplary structural block diagram of a pressure detection circuit according to an embodiment of the present disclosure. As shown in FIG. 2, the pressure detection circuit comprises a collection sub-circuit 21 and a reading sub-circuit 22.

The collection sub-circuit 21 is configured to receive an external pressure signal and convert the external pressure signal into a voltage signal under the control of a gating signal.

The reading sub-circuit 22 is configured to receive the voltage signal and output a detection output signal related to the voltage signal.

The collection sub-circuit 21 and the reading sub-circuit 22 are powered by a constant current source respectively.

When the gating signal is "true", the collection sub-circuit 21 receives an external pressure signal and converts the external pressure signal into a corresponding voltage signal, thereby outputting a detection output signal.

In the present disclosure, the collection sub-circuit 21 and the reading sub-circuit 22 are powered by a constant current source respectively, and current of each of the constant current sources is greater than operating current in a detection circuit in the related art, which can reduce the influence of leakage current on a detection result.

Figure 3:
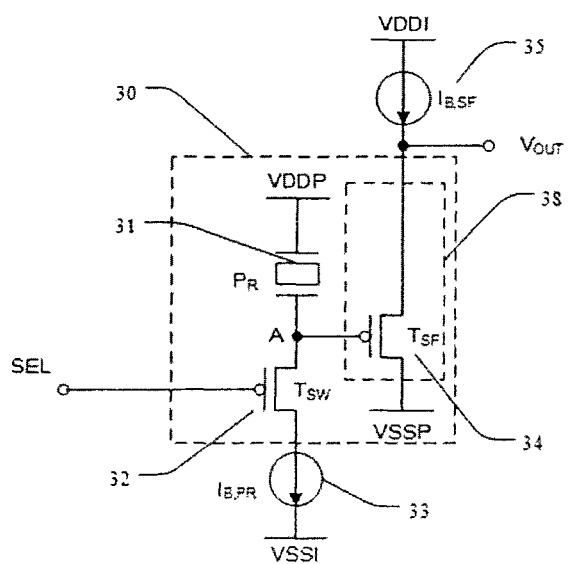
FIG. 3 illustrates an exemplary circuit structural diagram of a pressure detection circuit according to an embodiment of the present disclosure.

FIG. 3 illustrates an exemplary circuit structural diagram of a pressure detection circuit according to an embodiment of the present disclosure. As shown in FIG. 3, the collection sub-circuit comprises a piezoresistive sensor 31 and a first gating transistor 32.

The piezoresistive sensor 31 has a first terminal connected to a first voltage signal VDDP, and a second terminal connected to a collection node A, and the piezoresistive sensor 31 is configured to receive an external pressure, and change a resistance value thereof according to the external pressure.

The first gating transistor 32 has a gate configured to receive a gating signal SEL, a first electrode connected to the collection node A, and a second electrode connected to a first constant current source 33, and the first gating transistor 32 is configured to be turned on or turned off under the control of the gating signal SEL, and when being turned on, cause the collection node A to output a voltage signal corresponding to the resistance value of the piezoresistive sensor 31.

Specifically, when the first gating transistor 32 is turned off under the control of the gating signal SEL, as the piezoresistive sensor 31 acts as a pull-up resistor, the node A is pulled up to a potential of the VDDP. When the first gating transistor 32 is turned on under the control of the gating signal SEL, current $I_{B,PR}$ of the first constant current source 33 flows through the piezoresistive sensor 31, and generates a divided voltage value at the node A. It should be illustrated that the gating transistor may be a P-type TFT transistor or an N-type TFT transistor. In the present embodiment, the first gating transistor 32 is a P-type TFT transistor.

In some embodiments, the reading sub-circuit comprises a voltage follower 38 connected to the collection node A, a second voltage signal VSSP, and a second constant current source 35, and is configured to output a detection output signal Vout to an output terminal of the voltage follower 38 according to the voltage signal at the node A, wherein the output detection output signal Vout is positively correlated with the voltage signal.

The voltage signal at the collection node A decreases as the resistance value of the piezoresistive sensor 31 increases. The detection output signal Vout increases as the voltage signal increases, and decreases as the voltage signal decreases. It can be seen that the detection output signal Vout decreases as the resistance value of the piezoresistive sensor 31 increases.

In some embodiments, the voltage follower 38 comprises a follower transistor 34 having a gate connected to the collection node A, a second electrode connected to the second voltage signal VSSP, and a first electrode connected to the second constant current source 35, wherein the first electrode of the follower transistor 34 further acts as an output terminal for the detection output signal Vout. In the present embodiment, both the gating transistor 32 and the follower transistor 34 are P-type TFT transistors.

Specifically, when the first gating transistor 32 is turned off, as the piezoresistive sensor 31 acts as a pull-up resistor, the node A is pulled up to the potential of the VDDP, and the follower transistor 34 is turned off. When the first gating transistor 32 is turned on, the current $I_{B,PR}$ of the first constant current source 33 flows through the piezoresistive sensor 31 and generates a bias voltage at the collection node A which may turn on the follower transistor 34, and thereby the follower transistor 34 is turned on. According to a value range of the follower transistor 34, those skilled in the art may set values of the first voltage signal VDDP, the second voltage signal VSSP, a third voltage signal VDDI, a fourth voltage signal VSSI, $I_{B,PR}$ and $I_{B,SF}$, so that the voltage at the collection node A satisfies turn-on conditions of the follower transistor 34, wherein the follower transistor 34 is a P-type TFT transistor. The follower transistor 34 is turned on to form a follow effect together with the first constant current source 35, so that the detection output signal $V_{OUT}$ changes as the potential at the node A changes. The detection output signal $V_{OUT}$ may be expressed by the following relational expression:

$$V_{out} = V_{VDDP} - I_{B,PR} \times R_{PR} + V_{RH,TSF}$$

where $V_{out}$ is a voltage value of the detection output signal $V_{OUT}$, $V_{VDDP}$ is a voltage value of the potential of the VDDP, $I_{B,PR}$ is a current value of the first constant current source 33, $R_{PR}$ is a resistance value of the piezoresistive sensor 31, and $V_{TH,TSF}$ is a threshold voltage value of the follower transistor 34.

Figure 4:
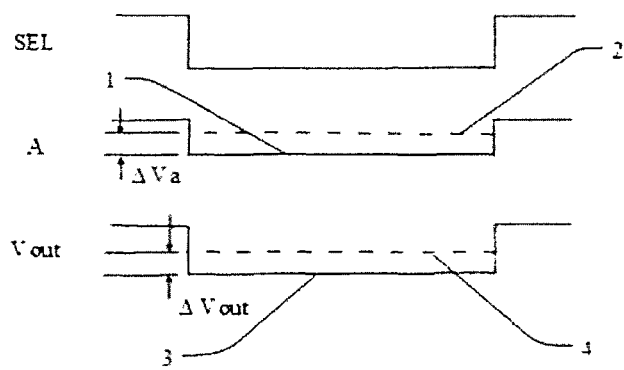
FIG. 4 illustrates an exemplary signal timing diagram of the pressure detection circuit in FIG. 3.

As shown in FIG. 4, illustrated is a signal timing diagram of the pressure detection circuit in FIG. 3. In the present embodiment, the resistance value of the piezoresistive sensor 31 decreases as the external pressure increases. As shown in FIG. 4, illustrated is a timing among the gating signal SEL, the voltage signal at the collection node A and the detection output voltage Vout. When the gating signal SEL is at a low level, the first gating transistor 32 is turned on. At this time, there is no external pressure applied, the resistance value of the piezoresistive sensor 31 is large, the voltage value at the node A is shown as a solid line 1, and the corresponding detection output signal Vout is shown as a solid line 3. When there is an external pressure applied, the resistance value of the piezoresistive sensor 31 becomes small, the voltage value at the collection node A is shown as a broken line 2, and the corresponding detection output signal Vout is shown as a broken line 4. In the figure, ΔVa is a voltage difference between the voltage at the collection node A when there is no external pressure applied and the voltage at the collection node A when there is an external pressure applied, and ΔVout is a voltage difference between a detection output signal Vout when there is no external pressure applied and a detection output signal Vout when there is an external pressure applied. ΔVa and ΔVout satisfy the following relational expression:

$$\Delta Va = \Delta Vout$$

This detection circuit has advantages in that turn-on resistance of the first gating transistor 32 does not influence the detection result as the voltage change at the collection node A is only related to a product of the current $I_{B,PR}$ of the first constant current source 32 and the resistance value PR of the piezoresistive sensor 31.

Figure 5:
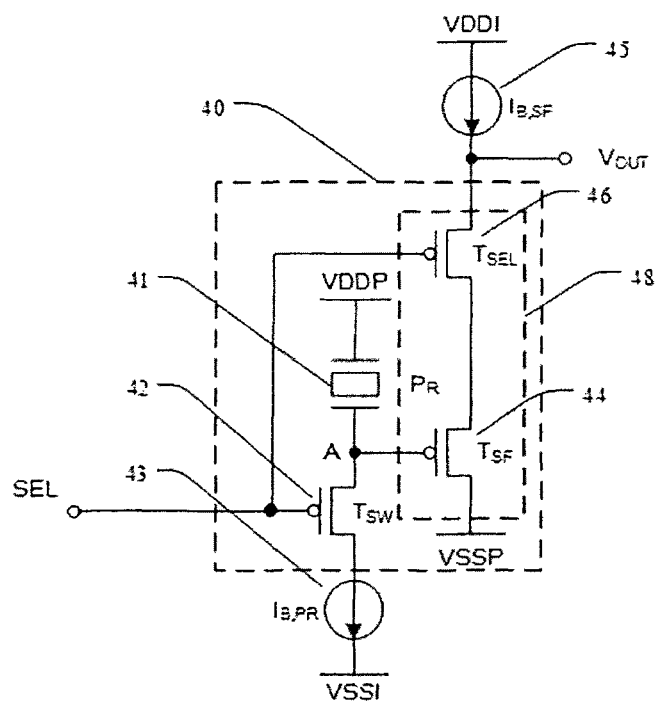
FIG. 5 illustrates an exemplary circuit structural diagram of a pressure detection circuit according to another embodiment of the present disclosure.

When the detection circuit is specifically applied to the touch panel, the collection sub-circuit, the first voltage VDDP, the second voltage signal VSSP, and the voltage follower 38 in the dashed box 30 are provided in each pixel unit in the touch panel, and remaining portions may be provided outside the pixel unit. FIG. 5 illustrates an exemplary circuit structural diagram of a pressure detection circuit according to another embodiment of the present disclosure. As shown in FIG. 5, a voltage follower 48 comprises a follower transistor 44 and a second gating transistor 46, wherein the follower transistor 44 has a gate connected to a collection node A, a second electrode configured to receive a second voltage signal VSSP, and a first electrode connected to a second electrode of the second gating transistor 46, and the second gating transistor 46 has a gate connected to a gating terminal to receive a gating signal SEL, and a first electrode connected to a second constant current source 45, wherein the first electrode of the second gating transistor 46 further acts as an output terminal for outputting a detection output signal Vout; and the second gating transistor 46 is configured to be turned on or turned off under the control of the gating signal, and when being turned off, turn off a connection between the follower transistor 44 and the output terminal.

Specifically, when a first gating transistor 42 is turned off, as a piezoresistive sensor 41 acts as a pull-up resistor, the voltage at the node A is pulled up to a potential at a VDDP, the follower transistor 44 is turned off, and at the same time, the second gating transistor 46 is turned off, which blocks an unstable voltage at the collection node when the first gating transistor 42 is turned off.

When the first gating transistor 42 is turned on, current $I_{B,PR}$ of a first constant current source 43 flows through the piezoresistive sensor 41 and generates a bias voltage at the node A which may turn on the follower transistor 44, and thereby the transistor follower 44 is turned on. According to a value range of the follower transistor 44, those skilled in the art may set values of the first voltage signal VDDP, the second voltage signal VSSP, a third voltage signal VDDI, a fourth voltage signal VSSI, $I_{B,PR}$ and $I_{B,SF}$, so that the voltage at the collection node A satisfies turn-on conditions of the follower transistor 44, wherein the follower transistor 44 is a P-type TFT transistor. The follower transistor 44 is turned on while the second gating transistor 46 is turned on to form a voltage follow effect, that is, the detection output signal $V_{OUT}$ changes as the potential at the node A changes. In the present embodiment, all the first gating transistor 42, the follower transistor 44 and the second gating transistor 46 are P-type TFT transistors.

When the detection circuit is specifically applied to the touch panel, the collection sub-circuit, the first voltage VDDP, the second voltage signal VSSP, and the voltage follower 48 in the dashed box 40 are provided in each pixel unit, and remaining portions may be provided outside the pixel unit.

Preferably, the resistance value of the piezoresistive sensor decreases as the external pressure increases. In practical applications, according to requirements, a piezoresistive sensor having a resistance value which increases as the external pressure increases may be selected, or a piezoresistive sensor having a resistance value which decreases as the external pressure increases may also be selected. Alternatively, a high-impedance piezoresistive sensor having an infinite resistance value when there is no pressure applied may be selected.

Figure 6:
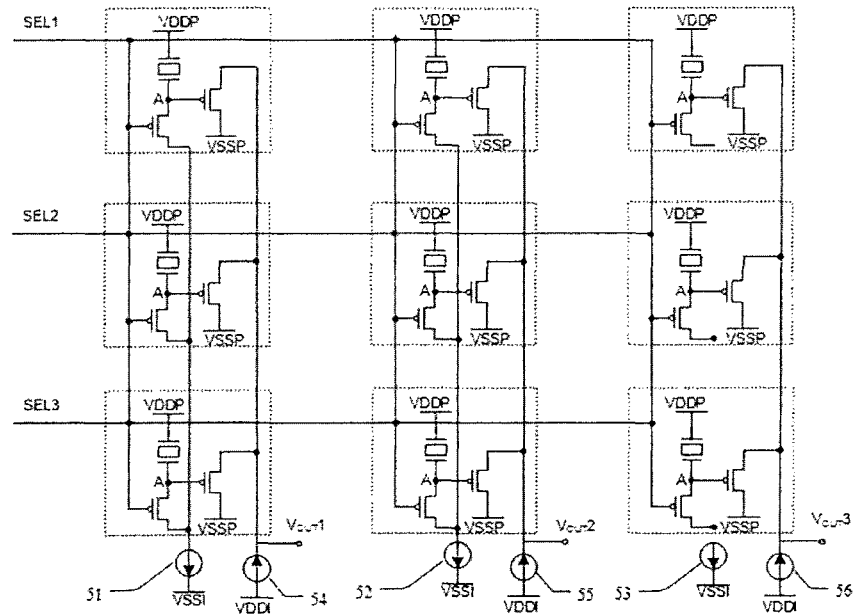
FIG. 6 illustrates an exemplary circuit structural diagram of a pressure detection circuit array according to an embodiment of the present disclosure.
Figure 7:
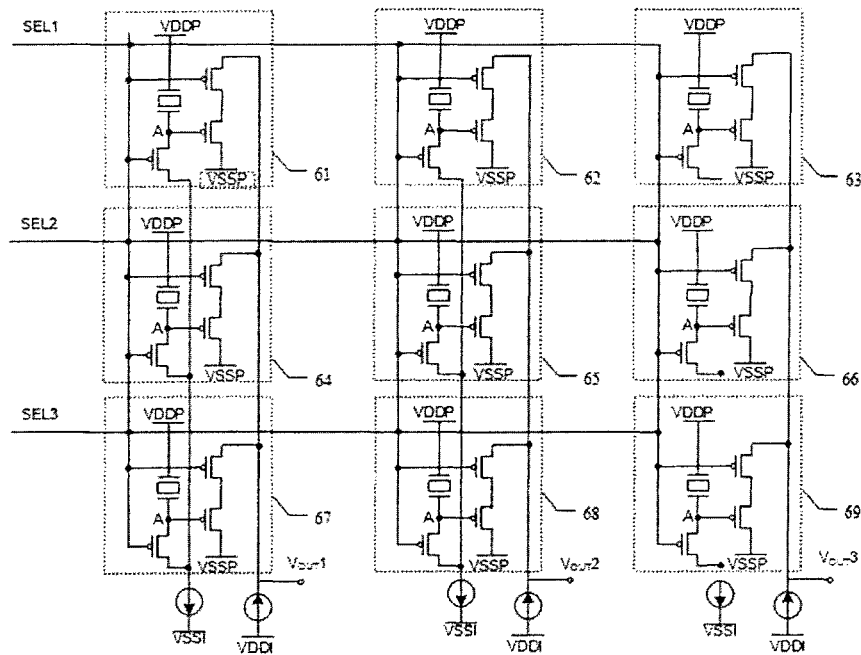
FIG. 7 illustrates an exemplary circuit structural diagram of a pressure detection circuit array according to an embodiment of the present disclosure.

Next, as shown in FIGS. 6 and 7, illustrated are exemplary circuit structural diagrams of a pressure detection circuit array according to an embodiment of the present disclosure respectively. The pressure detection circuit array comprises a plurality of pressure detection circuits according to the above multiple embodiments. Here, FIG. 6 is an application array of the pressure detection circuit in FIG. 3, and FIG. 7 is an application array of the pressure detection circuit in FIG. 5. A wide pressure detection range may be detected by the application arrays of the pressure detection circuits.

In some embodiments, gating terminals of the same row of pressure detection circuits are electrically connected and receive the same gating signal, output terminals of the same column of pressure detection circuits are electrically connected and output a detection output signal, a first constant current source supplies constant current to collection sub-circuits of the same column of pressure detection circuits, and a second constant current source supplies constant current to reading sub-circuits of the same column of pressure detection circuits.

As shown in FIG. 6, gating terminals of a first row of pressure detection circuits are electrically connected and receive a gating signal SEL1. Similarly, gating terminals of a second row of pressure detection circuits and a third row of pressure detection circuits are electrically connected and receive a gating signal SEL2 and a gating signal SEL3 respectively.

Output terminals of a first column of pressure detection circuits are electrically connected and output a detection output signal Vout1. Similarly, output terminals of a second column of pressure detection circuits and a third column of pressure detection circuits are electrically connected and output a detection output signal Vout2 and a detection output signal Vout3 respectively.

A first constant current source 51 supplies constant current to collection sub-circuits of the first column of pressure detection circuits. Similarly, a first constant current source 52 and a first constant current source 53 supply constant current to collection sub-circuits of the second column of pressure detection circuits and collection sub-circuits of the third column of pressure detection circuits respectively.

A second constant current source 54 supplies constant current to the collection sub-circuits of the first column of pressure detection circuits, and a second constant current source 55 and a second constant current source 56 supply constant current to the collection sub-circuits of the second column of pressure detection circuits and the collection sub-circuits of the third column of pressure detection circuits respectively.

It can be seen that the first constant current sources and the second constant current sources may be configured according to a number of columns of pixel units, that is, the number of columns of the pixel units is the same as a number of the first constant current sources and a number of the second constant current sources.

A connection manner of the pressure detection circuit array of FIG. 7 is similar to that of FIG. 6, and details thereof are not described here again. It should be illustrated that each pressure detection circuit in FIG. 7 incorporates a second gating transistor, wherein only a detection output signal of a gated pressure detection circuit is read when the detection output signal is read, and due to turn-off of the second gating transistor, a detection output signal of an un-gated pressure detection circuit is disconnected from the voltage output terminal. Therefore, uncertainty of the detection output signal caused by uncertainty of the voltage value at the collection node A due to high impedance of a piezoresistive sensor of the un-gated pressure detection circuit is prevented from influencing the accuracy of the detection output signal of the gated pressure detection circuit, thereby obtaining an effect of improving the detection accuracy.

In addition, it can be understood that FIGS. 6 and 7 only provide an array structure having three rows and three columns, and the arrangement of the above arrays is also applicable to a combined array having various rows and columns.

The present disclosure further provides a touch panel. The touch panel comprises the pressure detection circuit array according to various embodiments of the present disclosure and an array of pixel units. Each of the pixel units has a pressure detection circuit arranged therein, and magnitude and a position of an external pressure are detected by the pressure detection circuit arranged in the pixel unit of the touch panel, thereby implementing touch.

As shown in FIG. 6, the collection sub-circuit, the first voltage VDDP, the second voltage signal VSSP, and the voltage follower of the pressure detection circuit are provided in each pixel unit, and the first constant current sources and the second constant current sources are provided outside the pixel unit.

Figure 8:
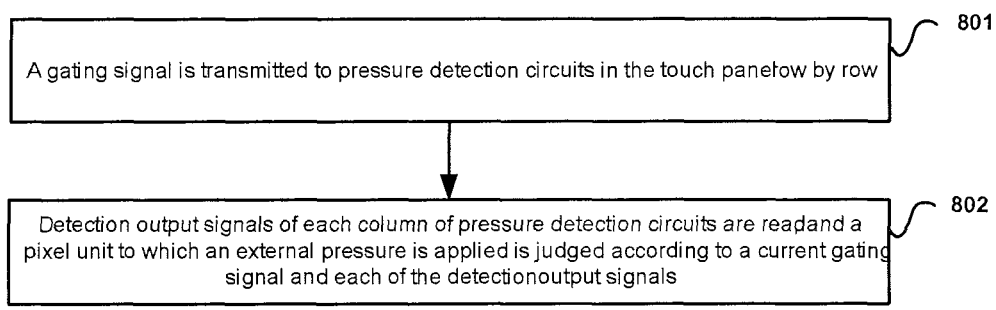
FIG. 8 illustrates a pressure detection method of a touch panel according to an embodiment of the present disclosure.
Figure 9:
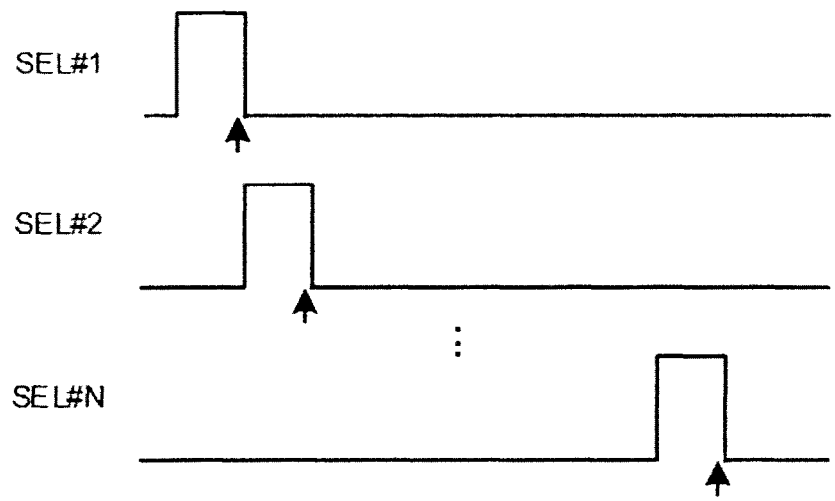
FIG. 9 illustrates an exemplary timing diagram of a gating signal in the pressure detection circuit array in FIG. 7.

FIG. 8 illustrates a pressure detection method of a touch panel according to an embodiment of the present disclosure. The method comprises the following steps.

In step 801, a gating signal is transmitted to pressure detection circuits in the touch panel row by row.

In step 802, detection output signals of each column of pressure detection circuits are read, and a pixel unit to which an external pressure is applied is determined according to a current gating signal and each of the detection output signals.

As shown in FIG. 7, each of the pixel units has a pressure detection circuit provided therein. When a gating signal SEL1 is transmitted to a first row of pixel units, the read detection output signals Vout1, Vout2, and Vout3 are output voltages of pressure detection circuits corresponding to a pixel unit 61, a pixel unit 62 and a pixel unit 63 respectively. Similarly, when a gating signal SEL2 is transmitted to a second row of pixel units, the read detection output signals Vout1, Vout2, and Vout3 are output voltages of pressure detection circuits corresponding to a pixel unit 64, a pixel unit 65, and a pixel unit 66 respectively. When a gating signal SEL3 is transmitted to a third row of pixel units, the read Vout1, Vout2, and Vout3 are output voltages of pressure detection circuits corresponding to a pixel unit 67, a pixel unit 68, and a pixel unit 69 respectively. Magnitude and a position of the applied pressure may be determined according to magnitude of the output voltage and a position of a pixel unit.

For convenience of understanding, a piezoresistive sensor having a resistance value which decreases as the pressure increases will be selected as an example for description. At this time, a detection output signal when there is no external pressure applied is used as a reference voltage value. Firstly, the gating signal SEL1 is transmitted to the first row of pixel units, and the voltages of the detection output signals Vout1, Vout2, and Vout3 are read. It is determined that the voltages of Vout1, Vout2, and Vout3 are not greater than the reference voltage, which indicates that there is no external pressure applied on the corresponding pixel unit 61, pixel unit 62 and pixel unit 63. Then, the gating signal SEL2 is transmitted to the second row of pixel units, and the voltages of the detection output signals Vout1, Vout2, and Vout3 are read. It is determined that the voltages of Vout2 and Vout3 are greater than the reference voltage, which indicates that there is an external pressure applied on the corresponding pixel unit 65 and pixel unit 66. Finally, the gating signal SEL3 is transmitted to the third row of pixel units, and the voltages of the detection output signals Vout1, Vout2, and Vout3 are read. It is determined that the voltages of Vout2 and Vout3 are greater than the reference voltage, which indicates that there is an external voltage applied on the corresponding pixel unit 68 and pixel unit 69. It can be seen that a pixel unit to which an external pressure is applied may be determined by a gating signal which is currently valid and comparison between voltages of various detection output signals Vout1, Vout2 and Vout3 with the reference voltage.

As shown in FIG. 8, illustrated is an exemplary timing diagram of a gating signal in the pressure detection circuit array in FIG. 7. As shown in FIG. 8, the gating signal is transmitted in an order of SEL1, SEL2, and SEL3 respectively, and a time point at which a previous pulse ends is a time point at which a next pulse starts. In the figure, a position of an arrow is a time point at which a corresponding detection output signal is read. The detection output signal is generally read at the end of a gating pulse before the arrival of a trailing edge of the gating pulse.

The flowcharts and block diagrams in the accompanying drawings illustrate architecture, functions, and operations of possible implementations of systems, methods, and computer program products according to various embodiments of the present disclosure. In this regard, each block of the flowcharts or block diagrams can represent a module, a program segment, or a portion of codes, which comprises one or more executable instructions for implementing specified logical functions. It should also be illustrated that in some alternative implementations, the functions noted in the block may also occur in a different order than that illustrated in the accompanying drawings. For example, two successively represented blocks may in fact be executed substantially in parallel, and they may sometimes be executed in a reverse order, depending upon the functionality involved. It should also be illustrated that each block of the block diagrams and/or flowcharts, and combinations of blocks in the block diagrams and/or flowcharts, can be implemented in a dedicated hardware-based system which performs the specified functions or operations, or can be implemented by a combination of dedicated hardware and computer instructions.

The above description is only a preferred embodiment of the present disclosure and a description of the principles of the applied technology. It should be understood by those skilled in the art that the scope of the present disclosure is not limited to the technical solutions formed by a specific combination of the above technical features, and should also encompass other technical solutions formed by any combination of the above technical features or equivalent features, for example, technical solutions formed by replacements of the above features by, but not limited to, technical features having similar functions to those disclosed by the present disclosure.

We claim:

1. A pressure detection circuit, comprising:
    a collection sub-circuit configured to receive an external pressure signal and convert the external pressure signal into a voltage signal under the control of a gating signal; and
    a reading sub-circuit configured to receive the voltage signal, and output a detection output signal related to the voltage signal,
    wherein the collection sub-circuit and the reading sub-circuit are powered by a constant current source respectively,
    wherein the collection sub-circuit comprises:
    a piezoresistive sensor having a first terminal configured to receive a first voltage signal and a second terminal connected to a collection node, wherein the piezoresistive sensor is configured to change a resistance value thereof according to the external pressure signal; and
    a first gating transistor having a gate configured to receive the gating signal, a first electrode connected to the collection node, and a second electrode connected to a first constant current source, wherein the first gating transistor is configured to cause a voltage signal corresponding to the resistance value of the piezoresistive sensor to be output at the collection node under the control of the gating signal.

2. The pressure detection circuit according to claim 1, wherein the reading sub-circuit comprises:
a voltage follower configured to output a detection output signal which is positively correlated with the voltage signal under the control of the voltage signal.

3. The pressure detection circuit according to claim 2, wherein the voltage follower comprises a follower transistor having a gate connected to the collection node, a first electrode connected to a second constant current source, and a second electrode configured to receive a second voltage signal, wherein the first electrode of the follower transistor further acts as an output terminal for outputting the detection output signal.

4. The pressure detection circuit according to claim 2, wherein the voltage follower comprises a follower transistor and a second gating transistor, wherein
the follower transistor has a gate connected to the collection node, a first electrode connected to a second electrode of the second gating transistor, and a second electrode connected to a second voltage signal,
the second gating transistor has a gate configured to receive the gating signal, and a first electrode connected to a second constant current source, wherein the first electrode of the second gating transistor further acts as an output terminal for outputting the detection output signal, and
the second gating transistor is configured to turn on/off a connection between the follower transistor and the output terminal under the control of the gating signal.

5. The pressure detection circuit according to claim 4, wherein the resistance value of the piezoresistive sensor decreases as the external pressure signal increases.

6. A pressure detection circuit array, comprising a plurality of pressure detection circuits according to claim 1.

7. The pressure detection circuit array according to claim 6, wherein gating terminals of the same row of pressure detection circuits are electrically connected and receive the same gating signal, and output terminals of the same column of pressure detection circuits are electrically connected and output a detection output signal, a first constant current source supplies constant current to collection sub-circuits of the same column of pressure detection circuits, and a second constant current source supplies constant current to reading sub-circuits of the same column of pressure detection circuits.

8. The pressure detection circuit array according to claim 6, wherein the collection sub-circuit comprises:
a piezoresistive sensor having a first terminal configured to receive a first voltage signal and a second terminal connected to the collection node, wherein the piezoresistive sensor is configured to change a resistance value thereof according to an external pressure signal; and
a first gating transistor having a gate configured to receive the gating signal, a first electrode connected to the collection node, and a second electrode connected to a first constant current source, wherein the first gating transistor is configured to cause a voltage signal corresponding to the resistance value of the piezoresistive sensor to be output at the collection node under the control of the gating signal.

9. The pressure detection circuit array according to claim 8, wherein the reading sub-circuit comprises:
a voltage follower configured to output a detection output signal which is positively correlated with the voltage signal under the control of the voltage signal.

10. The pressure detection circuit array according to claim 9, wherein the voltage follower comprises a follower transistor having a gate connected to the collection node, a first electrode connected to a second constant current source, and a second electrode configured to receive a second voltage signal, wherein the first electrode of the follower transistor further acts as an output terminal for outputting the detection output signal.

11. The pressure detection circuit array according to claim 9, wherein the voltage follower comprises a follower transistor and a second gating transistor, wherein
the follower transistor has a gate connected to the collection node, a first electrode connected to a second electrode of the second gating transistor, and a second electrode connected to a second voltage signal,
the second gating transistor has a gate configured to receive the gating signal, and a first electrode connected to a second constant current source, wherein the first electrode of the second gating transistor further acts as an output terminal for outputting the detection output signal, and
the second gating transistor is configured to turn on/off a connection between the follower transistor and the output terminal under the control of the gating signal.

12. The pressure detection circuit array according to claim 8, wherein the resistance value of the piezoresistive sensor decreases as the external pressure signal increases.

13. A touch panel, comprising an array of pixel units and the pressure detection circuit array according to claim 6, wherein each of the pixel units has a pressure detection circuit provided therein.

14. A pressure detection method of the touch panel according to claim 13, comprising:
transmitting a gating signal to the pressure detection circuits in the touch panel row by row; and
reading detection output signals of each column of pressure detection circuits, and determining a pixel unit to which an external pressure is applied according to a current gating signal and each of the detection output signals.

* * * * *